(12) United States Patent
Ishii et al.

(10) Patent No.: US 6,198,683 B1
(45) Date of Patent: Mar. 6, 2001

(54) MEMORY DEVICE

(75) Inventors: Yuki Ishii; Shinichi Yamada, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/563,846

(22) Filed: May 4, 2000

(30) Foreign Application Priority Data

May 18, 1999 (JP) .................................................. 11-137612

(51) Int. Cl.$^7$ ....................................................... G11C 7/00
(52) U.S. Cl. ...................... 365/226; 365/189.09; 365/205
(58) Field of Search .................................. 365/226, 227, 365/205, 207, 208, 189.09

(56) References Cited

U.S. PATENT DOCUMENTS

| | | | | |
|---|---|---|---|---|
| 5,363,333 | * | 11/1994 | Tsujimoto | 365/201 |
| 5,373,477 | * | 12/1994 | Sugibayashi | 365/226 |
| 5,430,682 | * | 7/1995 | Ishikawa et al. | 365/226 |
| 5,469,395 | * | 11/1995 | Kuwabara et al. | 365/207 |
| 5,831,910 | * | 11/1998 | Suzuki et al. | 365/189.11 |

* cited by examiner

Primary Examiner—Son Mai
(74) Attorney, Agent, or Firm—Arent Fox Kintner Plotkin & Kahn, PLLC (57) ABSTRACT

A memory device comprising: a step-down voltage generating circuit for generating a first step-down voltage by stepping down a power-supply voltage, and a second step-down voltage lower than said first step-down voltage; a peripheral circuit to which said first step-down voltage is supplied; and a memory core to which said second step-down voltage is supplied, wherein said step-down voltage generating circuit comprises a first step-down circuit for generating said first step-down voltage from said power-supply voltage supplied thereto, and a second step-down circuit for generating said second step-down voltage from said first step-down voltage supplied thereto, and a consumed current corresponding to said second step-down voltage is a first current value in a first operating period, and a second current value lower than said first current value in a second operating period.

8 Claims, 10 Drawing Sheets

Prior Art

FIG. 12

Step-down Voltage Generator

FIG. 13

MEMORY DEVICE

BACKGROUND OF THE INVENTION

1. Field of the Invention

This invention relates to a memory device, and in more particular, to a memory device for generating a plurality of step-down voltages from an externally supplied power-supply voltage.

2. Prior Art

In order to increase the reliability and decrease the power consumption of transistors of internal circuits in a memory device such as a DRAM, or in order for stable operation of the internal circuits when the externally supplied power-supply voltages changes, the internal circuits are operated with an internal power supply voltage that is generated by stepping down and smoothing the external power-supply voltage.

In this case, when a plurality of step-down voltages are required in the memory device, a plurality of step-down circuits have been used in the memory device, and each step-down circuit directly steps down the external power-supply voltage to generate a plurality of step-down voltages. In the case of a reference level where the required step-down voltage does not require drive capability, the external power-supply voltage may be divided by resistance.

Figure 11:
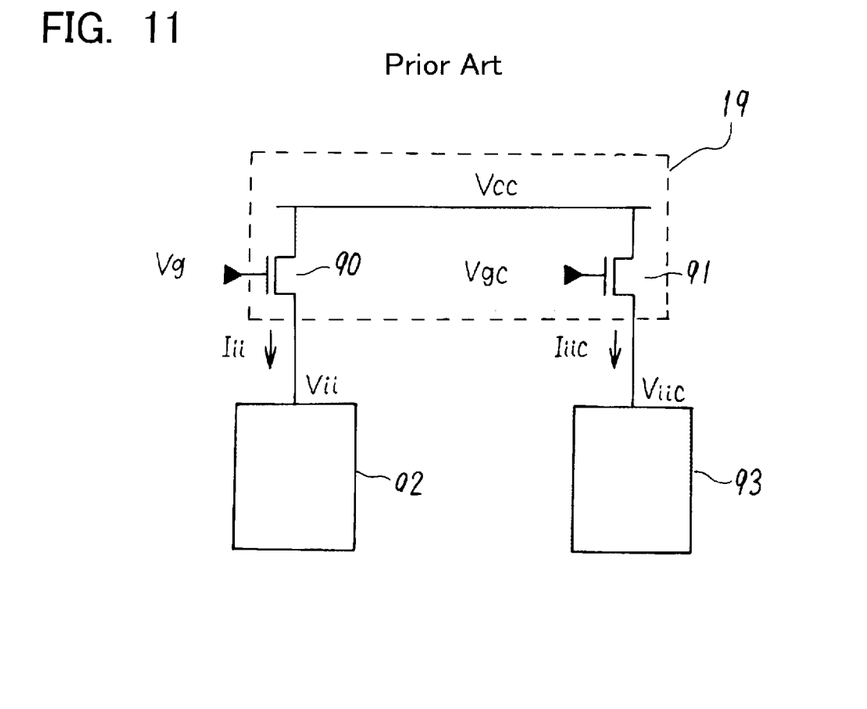
FIG. 11 is schematic drawing of a prior step-down voltage generating circuit.

FIG. 11 is a schematic drawing of a step-down voltage generating circuit for a prior memory device. The prior step-down voltage generating circuit 19 comprises a NMOS transistor 90 for generating a first step-down voltage Vii from an external power-supply voltage Vcc, and a NMOS transistor 91 for generating a second step-down voltage Viic from the external power-supply voltage Vcc.

The drain of the NMOS transistor 90 is connected to the external power-supply voltage Vcc, and the gate is connected to the reference level Vg. The reference level Vg is set as follow, as the threshold voltage Vth of the NMOS transistor 90.

$$Vg=Vii+Vth$$

In addition, the first step-down voltage Vii is supplied from the source of the NMOS transistor 90 to a first internal circuit 92. Iii is the current consumed by the first internal circuit 92, and is the current flowing between the drain and source of the NMOS transistor 90.

Moreover, the drain of the NMOS transistor 91 is connected to the external power-supply voltage Vcc, and the gate is connected to the reference level Vgc. The reference level Vgc is set as follow, as the threshold voltage Vth of the NMOS transistor 91.

$$Vgc=Viic+Vth$$

In addition, the second step-down voltage Viic is supplied from the source of the NMOS transistor 91 to a second internal circuit 93. Iiic is the current consumed by the second internal circuit, and is the current flowing between the drain and source of the NMOS transistor 91.

Figure 12:
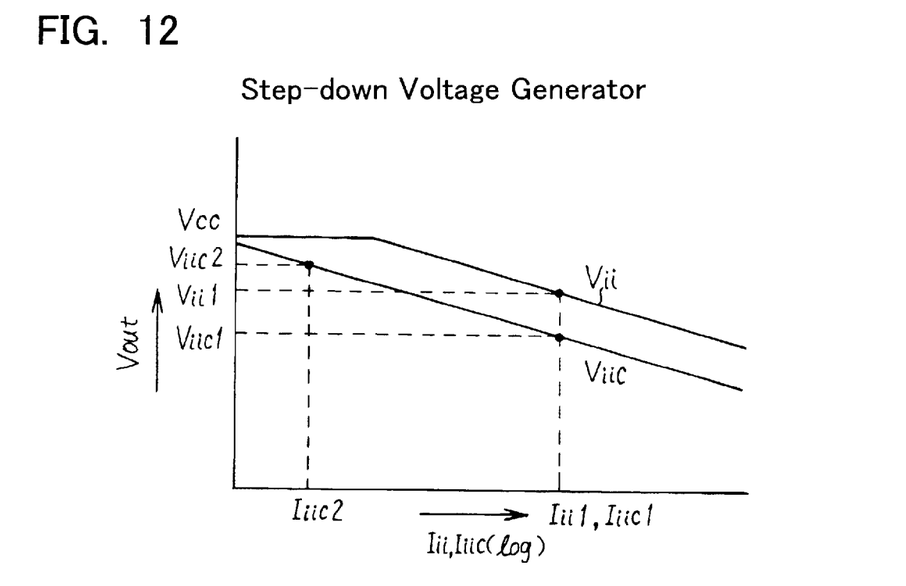
FIG. 12 is a drawing showing the characteristics of a prior step-down voltage generating circuit.

FIG. 12 is a drawing showing the characteristics of the output voltage of a prior step-down voltage generating circuit. The horizontal axis shows the current consumption of the internal circuits, and the vertical axis shows the output voltage of the step-down voltage generating circuit. FIG. 12 explains the relationship between the first step-down voltage Vii and the second step-down voltage Viic when the consumed current of the internal circuits is normal or extremely low. The consumed current shown along the horizontal axis is a Log scale.

The prior step-down voltage generating circuit was designed so the internal circuits would operate normally when the first and second internal circuits consumed the normal current Iii1, Iiic1; for example when the second step-down voltage Viic is set to be less than first step-down voltage Vii (Vii1>Viic). However, when the operating speed of the internal circuits drops, the consumed current Iii1 of the first internal circuit 92 that is supplied with the first step-down voltage Vii is equal to the normal value due to leaked current, and when the leak current Iiic2 of the second internal circuit 93 that is supplied with the second step-down voltage Viic is less than normal, the second step-down voltage Viic2 becomes greater than first step-down voltage Vii1 (Vii1<Viic2), and there may malfunction of the second internal circuit 93 to which the second step-down voltage Viic2 is supplied.

The reason that the second step-down voltage Viic rises is as follows. When the consumed current Iiic drops, the source voltage of the transistor 91 rises and the transistor 91 is in the sub-threshold operation state where the voltage between the gate and source is less than the threshold voltage. As a result, the source voltage Viic rises to a level near the drain voltage Vcc.

For example, in a memory device where the first step-down voltage Vii is supplied to the peripheral circuits and the second step-down voltage Viic is supplied to a sense amp, the memory device is designed such that it operates normally when the voltage relationship is:

$$Vii>viic$$

In order to suppress the consumed current in the sense amp of the cell array, which uses a large part of the consumed current of the memory device, another lower voltage Viic than vii is used for the sense amp. Here, where there is no access operation of the memory cell, such as long standby period of the memory device, or a power-down period when the entire device operation actually stops, since the consumed current of the sense amp of the cell array drops, it is not possible to maintain the aforementioned voltage relationship, resulting in the kinds of malfunction described below.

Figure 13:
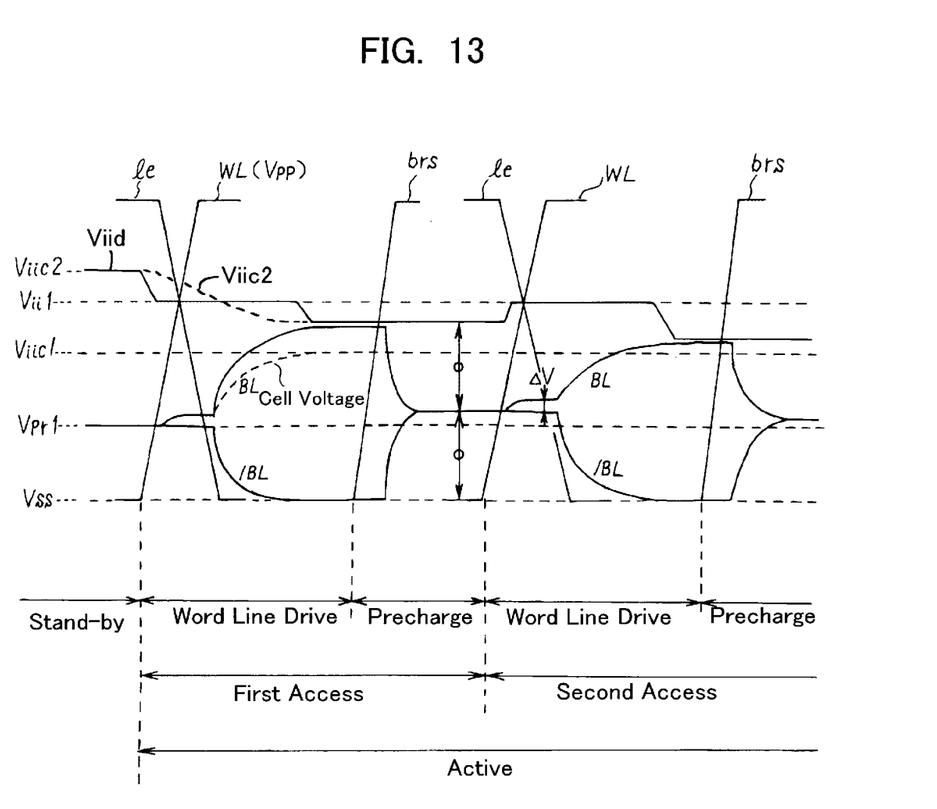
FIG. 13 is a drawing showing the operation waveform of a prior memory cell.

FIG. 13 shows the operating waveform when the memory cell first becomes active after the relatively long standby period, or after the power-down period. Since the consumed current Iiic is very small during the standby period of the memory device or the power-down period, the second step-down voltage Viic rises to Viic2 as shown in FIG. 12.

Therefore, the voltage of one bit line that is driven by the sense amp becomes the risen second step-down voltage Viic2. Further during the word-line drive period due to the first access, it does not drop to the prescribed voltage Viic1 by the consumed current due to data amplification of the bit line. Therefore, during the following pre-charge period, when the bit-line short signal brs becomes active and the bit lines BL, /BL are shorted, the voltage of the bit lines BL, /BL becomes ½ the bit-line BL voltage at that instant (Viic2 and ground potential) and becomes larger than the prior pre-charge voltage Vpr1 (½ of Viic1). In the operating waveform drawing of FIG. 13, when activation of the sense amp begins, the overdrive waveform wherein the drive power supply is temporarily made the first step-down voltage Vii, is shown.

When the voltage of the bit lines BL, /BL becomes high like this, the margin of the sense amp with respect to the H-level data written in the cell becomes small, and there is a possibility of malfunction when reading during the second access.

When the drive voltage of the word line WL is the step-up voltage Vpp, H level of the cell becomes the voltage of the threshold voltage subtracted from the step-up voltage Vpp (Vpp−Vth). Normally the step-up voltage is set such that Vpp−Vth=Viic. By taking the bit-line capacity to be Cb, the cell capacity to be Cs and bit-line pre-charge voltage to be Vpr, then the change in bit-line voltage dV when reading a cell of H level (Viic1) is calculated from $$Cb \times Vpr + Cs \times Viic1 = (Cb+Cs) \times (Vpr+dV)$$

to obtain:

$$dv = Cs \times (Viic1 - Vpr)/(Cb+Cs)$$

This potential difference dV between the pair of bit lines is detected and amplified by the sense amp. Also, from the equation above, it can be seen that when the pre-charge voltage Vpr of the bit lines becomes high, the sense amp detective margin disappears. Therefore, it is necessary that the second step-down voltage Viic does not increase even when the consumed current of the sense amp of the cell array drops during the standby period or power-down period.

SUMMARY OF THE INVENTION

The objective of the present invention is to provide a memory device for generating a plurality of step-down voltages from an external power-supply voltage, and for preventing malfunction of the internal circuits by maintaining the voltage relationship between the plurality of step-down voltages.

In order to accomplish the aforementioned objective, according to the present invention, a memory device, having a memory core with a plurality of memory cells located at cross sections of word lines and bit lines, and a step-down voltage generating circuit that steps down the power-supply voltage to generate a first step-down voltage, and also generates a second step-down voltage lower than said first step-down voltage, and comprises:

a sense amp, being supplied with said second step-down voltage as a driving voltage, for detecting the potential of said bit lines, and driving the bit line to said second step-down voltage; and a reset circuit for resetting said bit lines to a pre-charge potential that is nearly in the middle of said second step-down voltage, wherein said step-down voltage generating circuit comprises a first step-down circuit for generating said first step-down voltage lower than said power-supply voltage supplied thereto, and a second step-down circuit for generating said second step-down voltage lower than said first step-down voltage supplied thereto.

With this invention, the step-down voltage generating circuit comprises a first step-down circuit, being supplied with the power-supply voltage, for generating a first step-down voltage that is lower than the supplied power-supply voltage, and a second step circuit, being supplied with the first step-down voltage, for generating a second step-down voltage that is lower than the supplied first step-down voltage. Therefore, the second step-down voltage will not exceed and become grater than the first step-down voltage even during the standby period or power-down period when the consumed current of the internal circuits supplied with the second step-down voltage is very low, thus it is possible to prevent malfunction of the internal circuits.

Moreover, the memory device of an embodiment of this invention comprises an active period where the consumed current corresponding to the second step-down voltage has a first current value, and a standby period where the consumed current has a second current value that is lower than the first current value. The memory device of another embodiment of the invention comprises an active period where the consumed current corresponding to the second step-down voltage has a first current value, and a power-down period where the consumed current has a second current value that is lower than the first current value. The memory device of yet another embodiment of the invention comprises a first operating period where the consumed current corresponding to the second step-down voltage has a first current value, and a second operating period where the consumed current has a second current value that is lower than the first current value.

In the embodiments of the present invention, the second current value drops during the standby period, the power-down period or the second operating period, however, since the second step-down voltage is generated by stepping down the first step-down voltage, the second step-down voltage does not rise to exceed the first step-down voltage, thus it is possible to prevent malfunctioning of the internal circuits of the memory device.

This invention also provides a LSI device, comprising:

a step-down voltage generating circuit for generating a first step-down voltage by stepping down a power-supply voltage and a second step-down voltage lower than said first step-down voltage;

a first internal circuit to which said first step-down voltage is supplied; and a second internal circuit to which said second step-down voltage is supplied, wherein said step-down voltage generating circuit comprises a first step-down circuit for generating said first step-down voltage from said power-supply voltage supplied thereto, and a second step-down circuit for generating said second step-down voltage from said first step-down voltage supplied thereto, and a consumed current corresponding to said second step-down voltage is a first current value in a first operating period, and a second current value lower than said first current value in a second operating period.

With this invention, since the step-down voltage generating circuit comprises a first step-down circuit for generating a first step-down voltage that is lower than the supplied power-supply voltage, and a second step-down circuit for generating a second step-down voltage that is lower than the supplied first step-down voltage, the second step-down voltage does not exceed and become larger than the first step-down voltage even during the second operating period when the current value consumed by the second internal circuits is low, and thus it is possible to prevent malfunction of the second internal circuits.

DESCRIPTION OF THE PREFERRED EMBODIMENTS

The preferred embodiments of the present invention will be explained in reference to the drawings. However, the technical scope of the invention is not limited by these embodiments.

Figure 1:
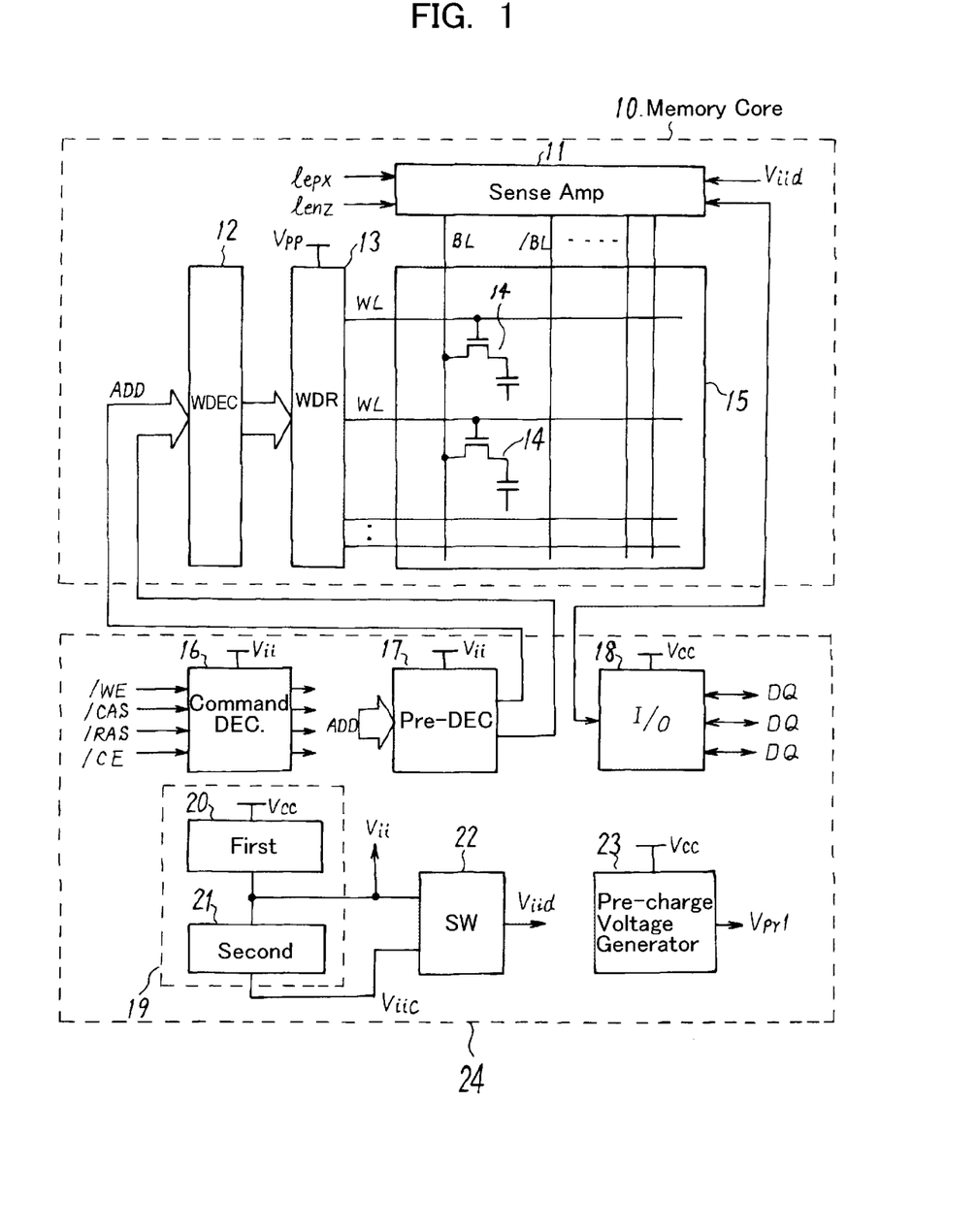
FIG. 1 is a schematic drawing of an embodiment of the invention.

FIG. 1 is a schematic drawing of the memory device of an embodiment of the present invention. The memory device of this embodiment comprises a memory core 10, having a memory-cell array 15 with a plurality of memory cells 14, a word decoder 12 for decoding address signals ADD, a word-line driver 13 for driving the word lines WL and sense amp 11 for amplifying the voltage potential of the bit lines BL, /BL, and peripheral circuits 24.

The peripheral circuits 24 comprise a command decoder 16 for being input the write-enable signal WE, column-address-strobe signal CAS, row-address-strobe signal RAS and chip-enable signal CE, a pre-decoder 17 for being input the address signal ADD, an input/output circuit 18 for performing input and output of data with the outside, a step-down voltage generating circuit 19 having a first step-down circuit 20 and a second step-down circuit 21, a switch circuit 22 for supplying a drive voltage Viid to the sense amp 11 for driving the sense amp 11 by switching between a first step-down voltage Vii, that is generated by the first step-down circuit 20, and a second step-down voltage Viic, that is generated by the second step-down circuit 21, and a pre-charge voltage generating circuit 23 for supplying a pre-charge voltage Vpr1 to the bit lines BL, /BL.

As shown in FIG. 1, in the peripheral circuits 24, most of the circuits, except for the input/output circuit 18 and voltage generating circuits 19, 23, use the first step-down voltage Vii as a power supply. Also, except for during overdrive period, the sense amp 11 in the memory core 10 uses the second step-down voltage Viic as a power supply via the drive voltage Viid.

Figure 2:
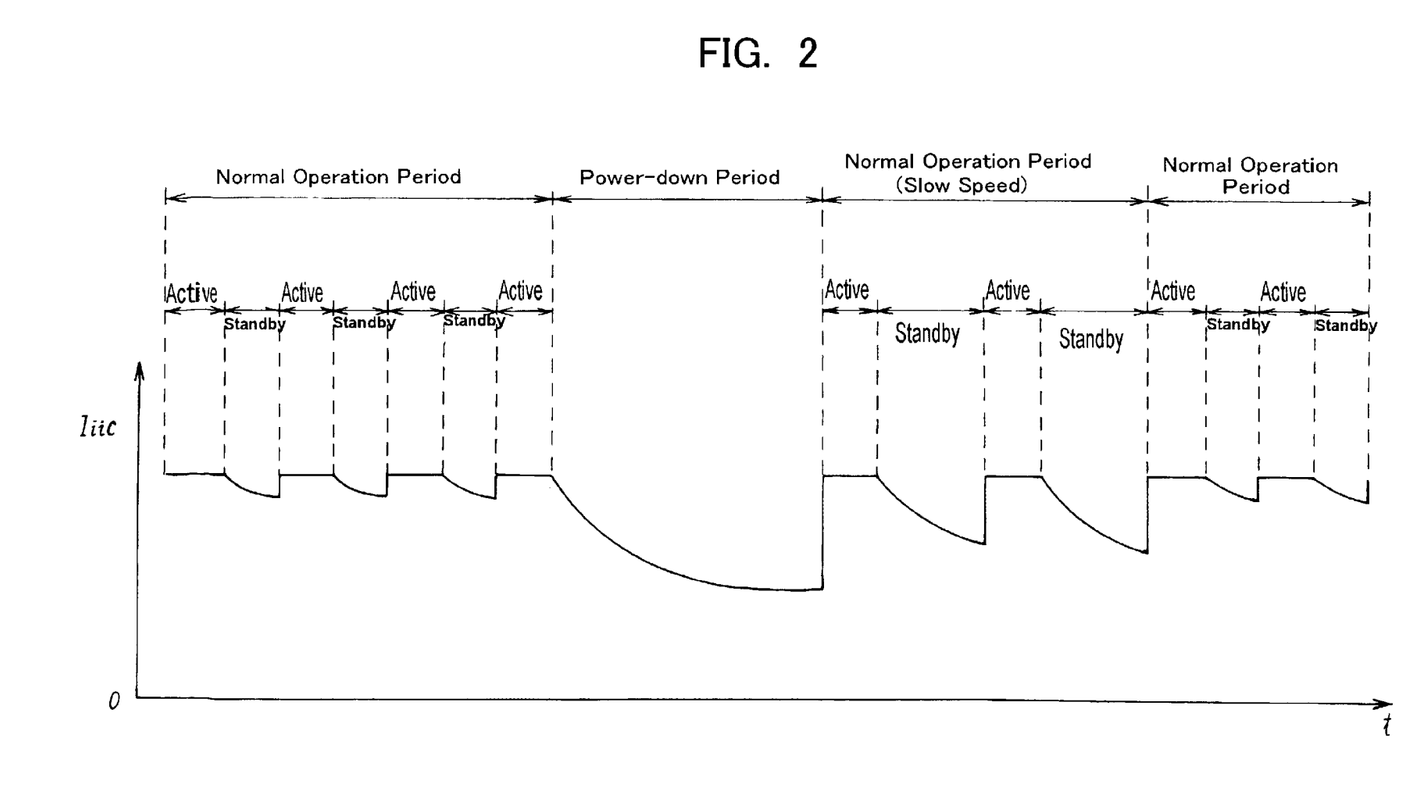
FIG. 2 is a drawing showing the characteristics of the consumed current of the memory device of an embodiment of the invention.

FIG. 2 is a drawing showing the characteristics of the consumed current Iiic of the sense amp that is supplied by the second step-down voltage Viic. The second step-down voltage Viic is generated by the second step-down circuit 21 as shown in FIG. 1 and supplied to the bit lines by way of the sense amp 11.

The consumed current Iiic is changed by the operating frequency of the sense amp, and becomes small during the standby period when operation of the sense amp 11 is stopped for a long time, or during the power-down period when the power consumption of the entire memory device is reduced more than in the standby period. In the active period, the word line is driven and the sense amp amplifies the voltage potential of the bit lines, after that the bit lines are pre-charged. In the standby period, the word line is no longer driven and access is not performed. In the power-down period, operation of the entire memory device is reduced, power consumption of the entire memory device is reduced even more than in the standby period, and the access is not performed.

In other words, the consumed current Iiic in the standby period is lower than in the active period, and the consumed current Iiic in the power-down period is lower than during normal operation. Also, during normal operation, the consumed current Iiic of the second operating period (during low speed) when the operating frequency of the sense amp 11 is low, is lower than in the first operating period when the operating frequency of the sense amp 11 is high.

In this way, the sense amp does not operate or operates very little during the standby period or power-down period, and the consumed current Iiic becomes small and the second step-down voltage Viic rises. However, in the step-down voltage generating circuit of this embodiment, the second step-down voltage Viic is generated by stepping down the first step-down voltage Vii, so the second step-down voltage Viic does not rise and exceed the first step-down voltage Vii even when the consumed current Iiic becomes small, thus it is possible to prevent malfunction of the internal circuits.

Figure 3:
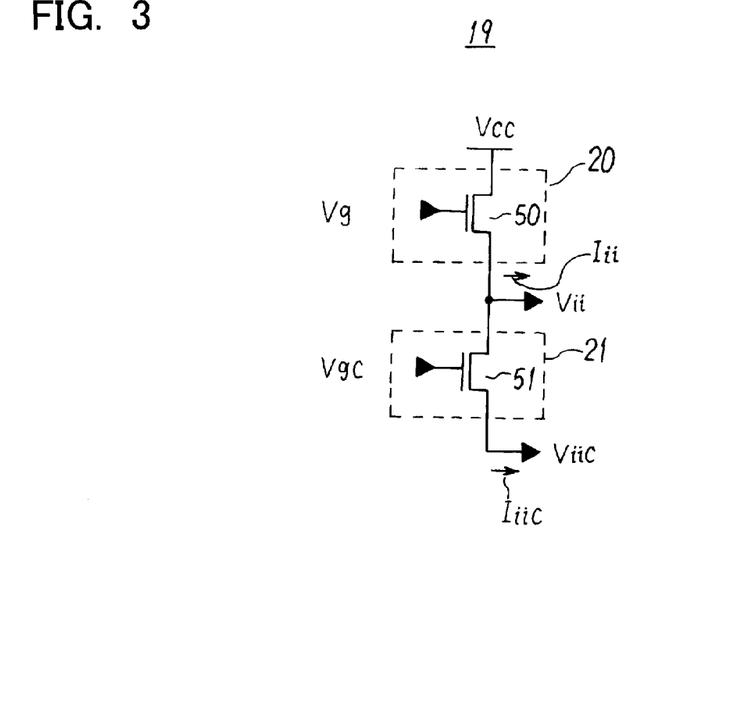
FIG. 3 is a schematic drawing of the step-down voltage generating circuit of a first embodiment of the invention.

FIG. 3 is a schematic drawing of the step-down voltage generating circuit of a first embodiment of the invention. The step-down voltage generating circuit 19 of this first embodiment of the invention comprises a first step-down circuit 20 having a NMOS transistor 50 for generating a first step-down voltage Vii from the external power-supply voltage Vcc, and a second step-down circuit 21 having a NMOS transistor 51 for generating a second step-down voltage Viic from the first step-down voltage Vii.

The drain of the NMOS transistor 50 is connected to the external power-supply voltage Vcc (for example, 2.5V), and the gate is connected to the reference level Vg (for example, 2.9V–3.0V). By taking the threshold voltage of the NMOS transistor 50 to be Vth (for example, 0.9V–1.0V) then the reference level Vg is set to:

$Vg = Vii + Vth$

It is therefore possible to obtain the first step-down voltage Vii (for example, 2.0V) from the source of the NMOS transistor 50.

Moreover, the drain of the NMOS transistor 51 is connected to the first step-down voltage Vii, and the gate is connected to the reference level Vgc (for example, 2.3V). By taking the threshold voltage of the NMOS transistor 51 to be Vth (for example, 0.8V) then the reference level Vgc is set to:

$Vgc = Viic + Vth$

It is therefore possible to obtain the second step-down voltage Viic (for example, 1.5V) from the source of the NMOS transistor 51.

In this way, since the step-down voltage generating circuit 19 of this embodiment generates the second step-down voltage Viic by stepping down the first step-down voltage Vii, the second step-down voltage Viic does not become larger and exceed the first step-down voltage Vii even during the standby period or power-down period when the consumed current Iiic of the second step-down voltage Viic is extremely small, and thus it is possible to prevent malfunction of the internal circuits of the memory device.

Figure 4:
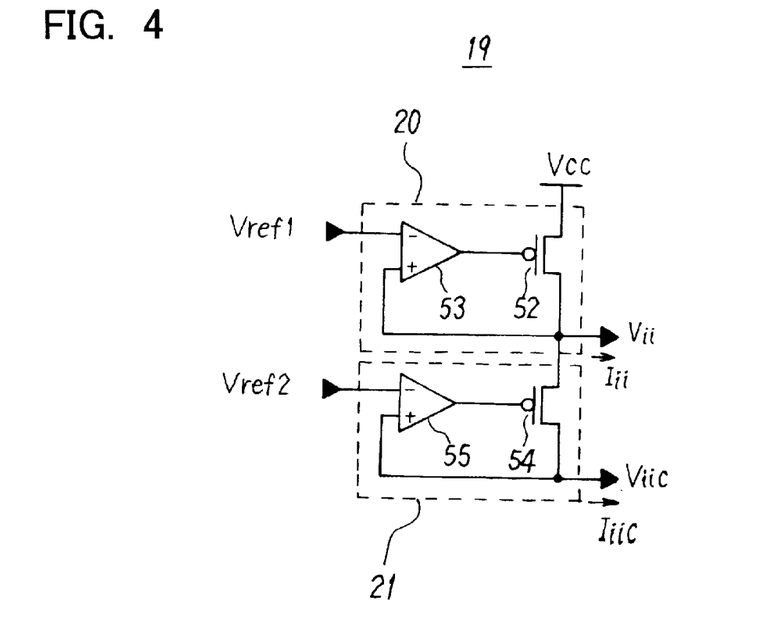
FIG. 4 is a schematic drawing of the step-down voltage generating circuit of a second embodiment of the invention.

FIG. 4 is a schematic drawing of the step-down voltage generating circuit of a second embodiment of the invention. The step-down voltage generating circuit 19 of this second embodiment of the invention comprises a first step-down circuit 20 having a PMOS transistor 52 and a differential amp 53, and a second step-down circuit 21 having a PMOS transistor 54 and a differential amp 55.

The source of the PMOS transistor 52 is connected to the external power-supply voltage Vcc, the gate is connected to the output of the differential amp 53, and the drain is connected to the output terminal of the first step-down voltage Vii. Also, a reference level Vref1, that is equal to the first step-down voltage vii, is input to the inverted input of the differential amp 53, and the first step-down voltage Vii is input to the non-inverted input.

The source of the PMOS transistor 54 is connected to the first step-down voltage Vii, the gate is connected to the output of the differential amp 55, and the drain is connected to the output terminal of the second step-down voltage Viic. Also, a reference level Vref2, that is equal to the second step-down voltage Viic, is input to the inverted input of the differential amp, and the second step-down voltage Viic is input to the non-inverted input.

In the step-down voltage generating circuit 19 of this second embodiment, the reference level Vref1 is set to be equal to the first step-down voltage Vii, and the reference level Vref2 is set to be equal to the second step-down voltage Viic. Also, for example, when the consumed current Iii of the internal circuits to which the first step-down voltage Vii is supplied increases and the first step-down voltage decreases, the output voltage of the differential amp 53 drops, the gate potential of the PMOS transistor 52 drops so that the current drive capability of the PMOS transistor 52 increases to assure a drop in the first step-down voltage Vii. On the other hand, when the first step-down voltage increases, the output voltage of the differential amp 53 increases, the gate potential of the PMOS transistor 52 rises so that the current drive capability of the PMOS transistor 52 drops to limit the rise in the first step-down voltage Vii. In other words, the current drive capability of the PMOS transistor 52 is controlled dynamically.

In the step-down voltage generating circuit 19 of this second embodiment, the change in the step-down voltages Vii, Viic is fed back by the differential amps 53, 55 and the gates of the PMOS transistors 52, 54 are controlled dynamically, so the PMOS transistors 52, 54 have an enough current supply capability depending on the operation period. Therefore, it is possible to make the size of the PMOS transistors 52, 54 smaller than the size of the NMOS transistors 50, 51 of the first embodiment, and thus it is possible to reduce the size of the entire step-down voltage generating circuit 19.

Moreover, in the step-down voltage generating circuit 19 of the second embodiment, the second step-down voltage Viic is generated by stepping down the first step-down voltage Vii, so the second step-down voltage Viic does not become larger than and exceed the first step-down voltage Vii, even during the standby period or power-down period when the consumed current Iiic of the second step-down voltage Viic is extremely small, and thus it is possible to prevent malfunction of the internal circuits of the memory device.

Figure 5:
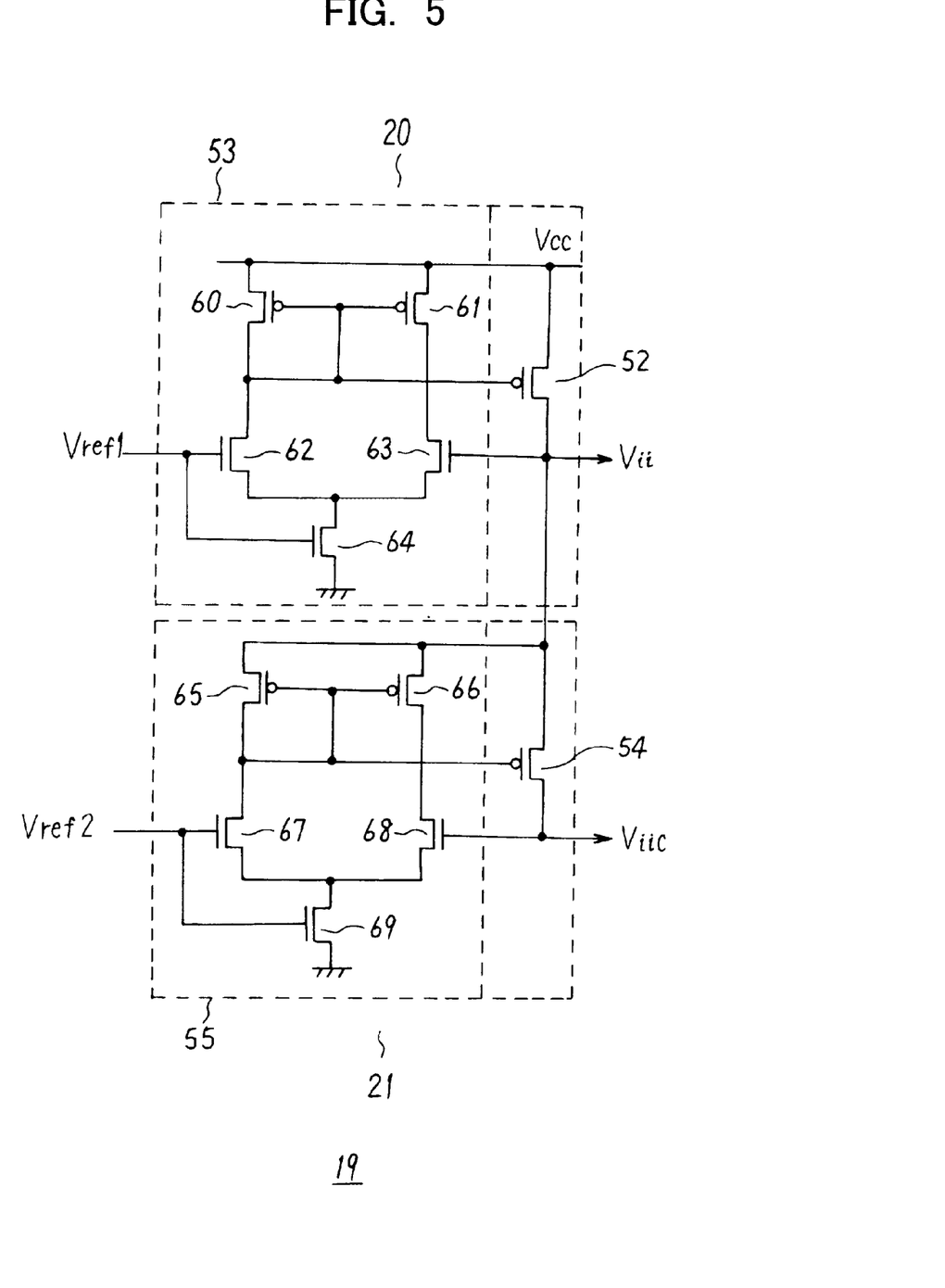
FIG. 5 is detailed drawing of the step-down voltage generating circuit of the second embodiment of the invention.

FIG. 5 is a detail drawing of the step-down voltage generating circuit 19 of the second embodiment of the invention shown in FIG. 4. The differential amp 53 of the first step-down circuit 20 comprises PMOS transistors 60, 61 and NMOS transistors 62, 63, that detect changes in the first step-down voltage to control the gate of the PMOS transistor 52 and to stabilize the first step-down voltage Vii.

For example, when the consumed current of the internal circuits supplied with the first step-down voltage Vii increases and the first step-down voltage Vii drops, the gate potential of the NMOS transistor 63 drops. The drop in gate potential of the NMOS transistor 63 is amplified by the differential amp 53, which causes the gate potential of the PMOS transistor 52 to drop. When this happens, the drive capability of the PMOS transistor 52 increases and assures a drop in the first step-down voltage Vii.

Moreover, the differential amp 55 of the second step-down circuit 21 comprises PMOS transistors 65, 66 and NMOS transistors 67, 68, 69, and it detects changes in the second step-down voltage Viic, controls the gate of the PMOS transistor 54 and stabilizes the second step-down voltage Viic. In this way, the step-down voltage generating circuit 19 of this second embodiment uses a plurality of MOS transistors, however, as mentioned above, since it is possible to reduce the size of the PMOS transistors 52, 54, it is possible to reduce the size of the entire step-down voltage generating circuit 19.

Figure 6:
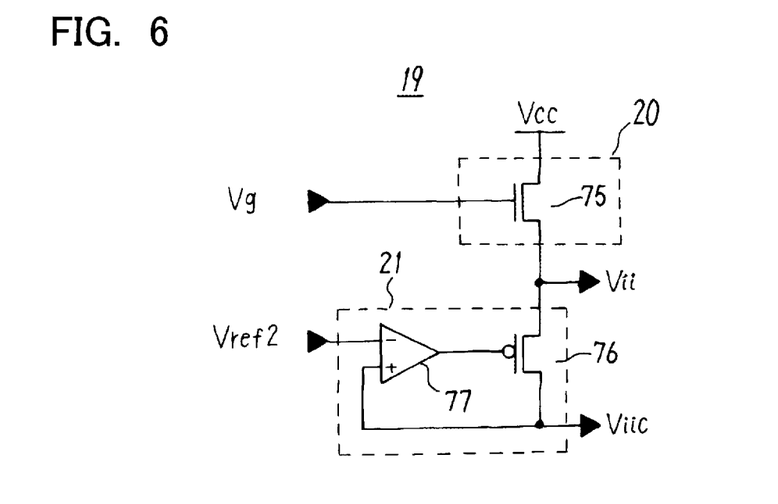
FIG. 6 is a schematic drawing of the step-down voltage generating circuit of a third embodiment of the invention.

FIG. 6 is a schematic drawing of a step-down voltage generating circuit of a third embodiment of the invention. The step-down voltage generating circuit of this third embodiment comprises a first step-down circuit 20 having a NMOS transistor 75, and a second step-down circuit 21 having a PMOS transistor 76 and differential amp 77. The operation of the first and second step-down circuits 20, 21 is the same as that shown in FIG. 3 or FIG. 4.

Figure 7:
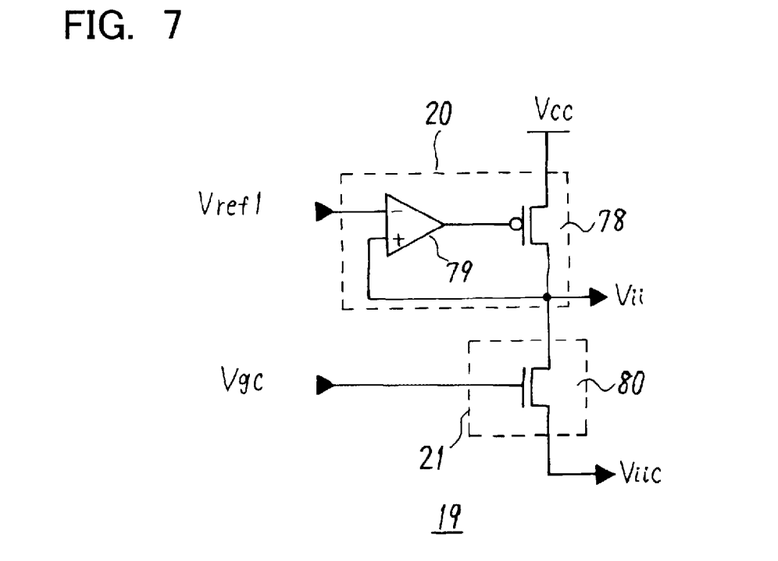
FIG. 7 is a schematic drawing of the step-down voltage generating circuit of a fourth embodiment of the invention.
Figure 8:
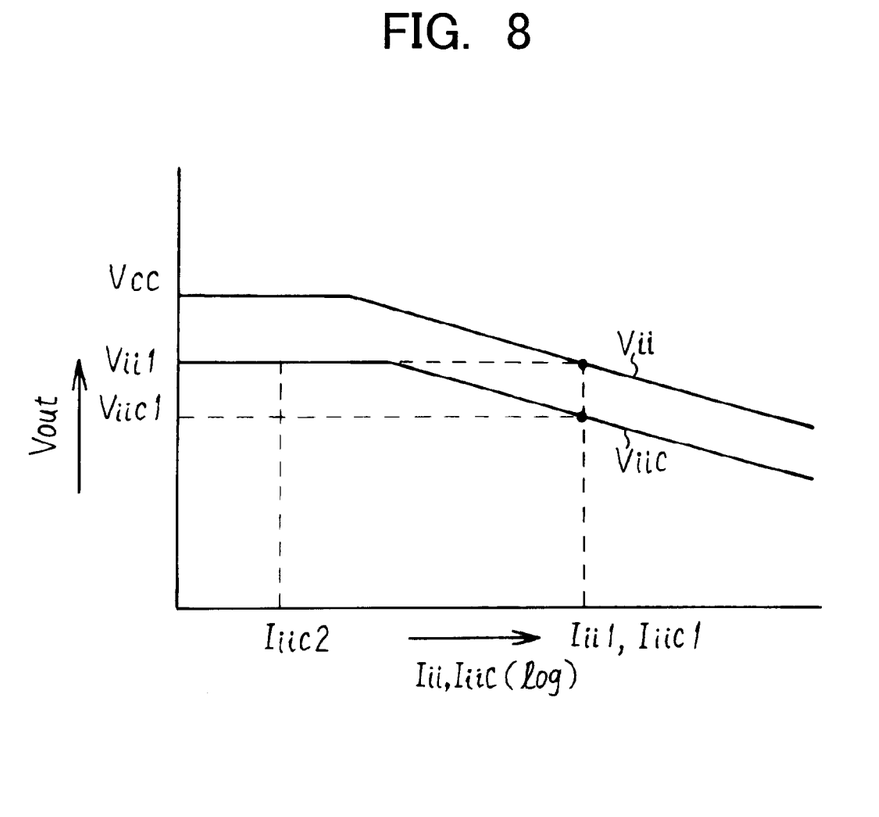
FIG. 8 is a drawing showing the characteristics of the step-down voltage generating circuit of the embodiments of this invention.

FIG. 7 is a schematic drawing of a step-down voltage generating circuit of a fourth embodiment of the invention. The step-down voltage generating circuit 19 of this fourth embodiment comprises a first step-down circuit 20 having a PMOS transistor 78 and differential amp 79, and a second step-down circuit 21 having a NMOS transistor 80. The operation of the first and second step-down circuits 20, 21 is similar to that shown in FIG. 3 or FIG. 4.

In the embodiments described above, the step-down voltage generating circuit generates two kinds of step-down voltages, however, it is possible for it to generate even more step-down voltages. However, each step-down voltage is generated in the order from the nearest, larger step-down voltage. By doing so, it is possible to maintain the voltage relationship between each step-down voltage even when the consumed current of the internal circuits supplied by the step-down voltages is low, and thus it is possible to prevent malfunction of the memory device.

Fig . 8 is a drawing showing the characteristics of the step-down voltage generating circuit of the embodiments of this invention, and shows the relationship of the first step-down voltage Vii and second step-down voltage Viic under the same conditions as shown in FIG. 12. As shown in FIG. 3 to FIG. 7, the step-down voltage generating circuit of the embodiments of this invention generates a second step-down voltage Viic by stepping down a first step-down voltage Vii, so the second step-down voltage Viic does not rise to exceed the normal voltage Vii1 of the first step-down voltage Vii even during a standby period or power-down period when the consumed current of the internal circuits supplied by the second step-down voltage Viic is extremely small (Iiic2), thus it is possible to prevent malfunction of the second internal circuits.

Figure 9:
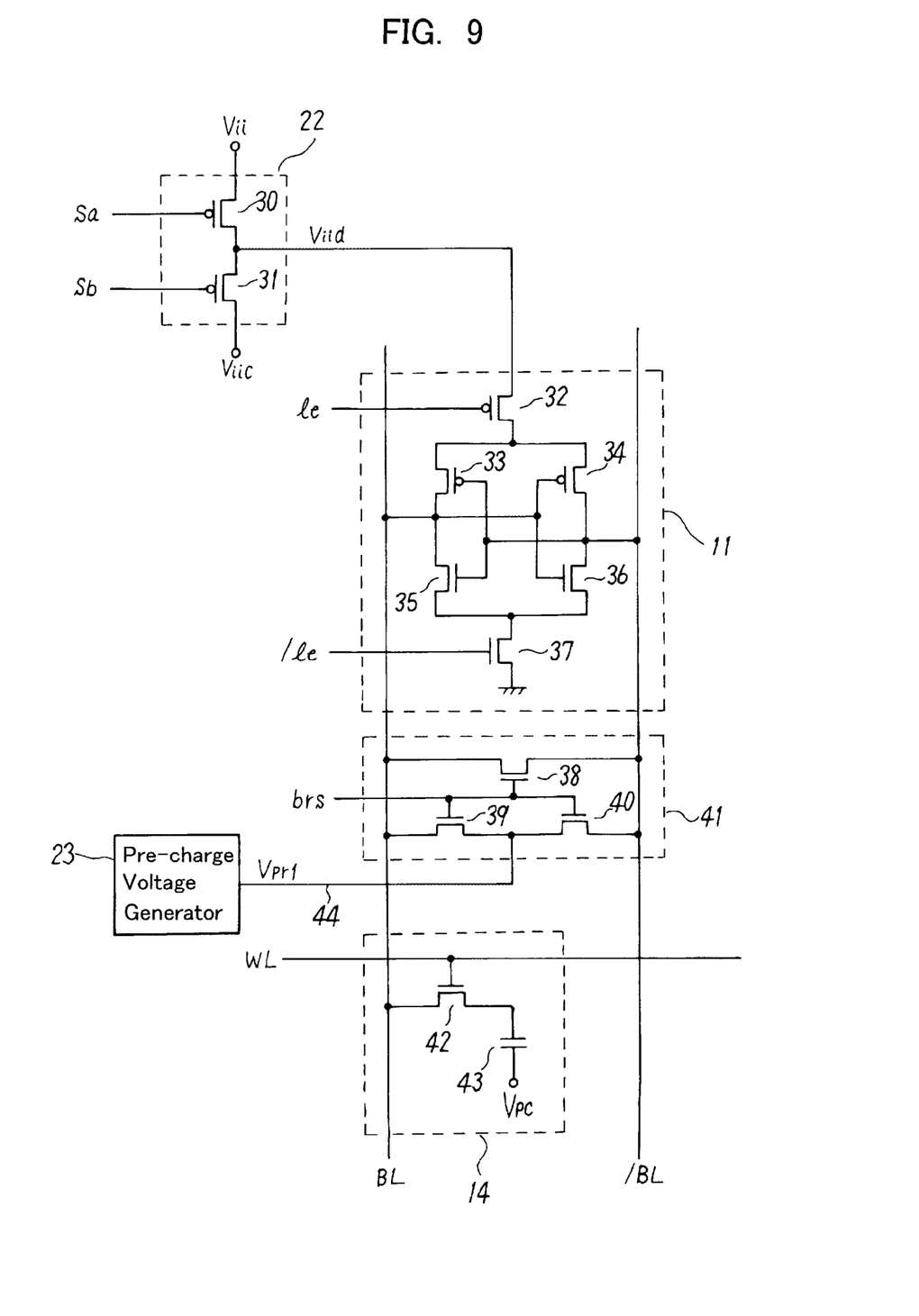
FIG. 9 is a schematic drawing of the memory cell, sense amp, etc. of an embodiment of this invention.

FIG. 9 is a schematic drawing of a memory cell 14 and sense amp 11 of the memory device of the embodiments of this invention. The memory cell 14 comprises a NMOS transistor 42 and capacitor 43 that are located where the word line WL crosses the bit line BL, /BL. A voltage Vpc for a cell-facing electrode is applied to one end of the capacitor 43.

A reset circuit 41 comprising NMOS transistors 38, 39, 40 is connected between bit lines BL, /BL, and a pre-charge voltage Vpr1, that is generated by a pre-charge voltage generating circuit 23, is applied to the connection point of the NMOS transistors 39, 40.

When the bit-line short signal brs becomes the H level as active level, the NMOS transistor 38 of the reset circuit 41 conducts and shorts the bit lines BL, /BL, and also the NMOS transistors 39, 40 conduct and apply the pre-charge voltage Vpr1 to the bit lines BL, /BL. However, since the wire 44 that supplies the pre-charge voltage Vpr1 from the pre-charge circuit 23 to the bit lines is thin and long, a limited time is required in order for the bit lines BL, /BL to reach the pre-charge voltage Vpr1 after shorting the bit lines. Also, the potential of the bit lines BL, /BL immediately after shorting the bit lines does not become the pre-charge voltage Vpr1, but is ½ the potential of the bit lines BL, /BL at that instant.

The sense amp 11 comprises PMOS transistors 32, 33, 34 and NMOS transistors 35, 36, 37, and is connected to power-supply voltage Viid for the sense amp by way of the PMOS transistor 32, and connected to the ground potential by way of the NMOS transistor 37.

The switching circuit 22 comprises PMOS transistors 30, 31, and the first step-down voltage Vii is supplied to the source of the PMOS transistor 30, and the second step-down voltage Viic is supplied to the source of the PMOS transistor 31. In addition, by making the level of the switching signals 'sa' or 'sb' L level, the first step-down voltage Vii or second step-down voltage Viic is supplied to the sense amp 11 as the sense amp power-supply voltage Viid.

The first step-down voltage Vii is applied to the sense amp 11 during the overdrive period in order to speed up opening of the bit lines BL, /BL, however, it is also supplied to the peripheral circuits of the memory device so a leak current flows in the peripheral circuits even during the standby period or power-down period of the memory device. On the other hand, the second step-down voltage Viic is supplied to the bit lines BL, /BL or memory cell 14 by way of the sense amp 11. In comparison to the peripheral circuits there is very little leak current in the sense amp 11 during the standby period. Also, there is almost no change in the consumed current in the peripheral circuits during normal operation or during low-speed operation of the standby period or power-down period. On the other hand, as mentioned above, there are large changes in the consumed current in the sense amp 11 of the memory core 10.

When the DRAM becomes active after the standby period or power-down period, the bit-line short signal brs become L level, and the short circuit between the bit lines BL, /BL is released. The potential of the word line WL rises, and the voltage corresponding to the data held in the capacitor 43 is applied to the bit lines BL. As a result, there is a potential difference dV between bit lines BL, /BL.

At the timing when a very small potential difference occurs between the bit lines BL, /BL, latch-enable signals 1e, /1e (L, H) are supplied at the gates of the PMOS transistor 32 and NMOS transistor 37, and the sense amp 11 is activated. By this, the sense amp 11 reads and amplifies the potential difference between the bit lines BL, /BL. After that, when the voltage of the word line drops, the reset circuit 41 of the bit lines is activated and resets both voltages of the bit-line pair to an intermediate voltage.

Figure 10:
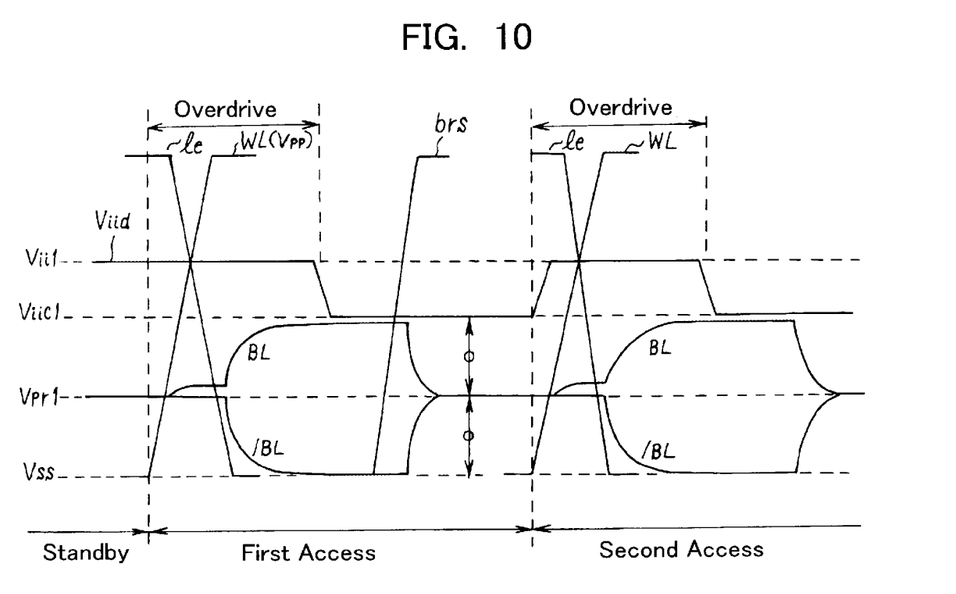
FIG. 10 is a drawing showing the operation waveform of a memory cell of an embodiment of this invention.

FIG. 10 is a drawing of the operating waveform for the memory device of these embodiments when the memory cell first becomes active after a long standby period.

During the standby period of the memory device, the second step-down voltage Vic is selected as the power-supply voltage Viid for the sense amp, and as described above, in these embodiment s, the second step-down voltage Viic does not exceed the first step-down voltage Vii.

In other words, since the second step-down voltage Viic is generated by stepping down the first step-down voltage Vii, the second step-down voltage Viic does not become larger than the first step-down voltage Vii even when the standby period is a comparatively long period, and the voltage Viid during the standby period only rises to the voltage Vii1 at most.

At the first access after the standby period ends, the voltage of the word line WL rises to a specified step-up voltage Vpp, and at the timing when a potential difference occurs between the bit lines BL, /BL, the latch-enable signal 1e falls, and the sense amp 11 is activated. The power-supply voltage Viid for the sense amp is switched to the first step-down voltage Vii during the overdrive period to speed up opening of the bit lines. However, in the embodiments of this invention, the standby voltage Viid rises to the voltage Vii1, so in FIG. 10, the value of that voltage Viid is Vii1.

The power-supply voltage Viid for the sense amp is switched to the second step-down voltage Viic after the overdrive period. When this happens, different than in the case of the prior memory device as shown in FIG. 13, the second step-down voltage Viic only rises at most to the first step-down voltage Vii1 during the standby period, so the power-supply voltage Viid for the sense amp drops to the desired voltage Viic1 by the current consumed during the sense amp operation by the first access. Also, the voltages of the bit lines are driven to voltages Viic1, 0 that are the same as normal.

After there becomes a sufficiently large potential difference between bit lines BL, /BL, the bit-line short signal brs becomes active, and the bit lines BL, /BL are shorted. In this way, the voltages of the bit lines BL, /BL become ½ the voltages of the bit lines BL, /BL at that instant, or in other words, Vpr=(Viic1)/2.

With the memory cell of the embodiments of this invention, the pre-charge voltage Vpr of the shorted bit lines is the same level as the pre-charge voltage Vpr1 that is generated by the pre-charge voltage generating circuit, and the pre-charge voltage Vpr does not become larger than the voltage Vpr1 as in the prior device. Therefore, the margin of the sense amp for the H-level data written in a cell does not become smaller, and malfunction does not occur easily on the second access.

The operating waveform in FIG. 10 is for when the memory cell is accessed for the first time after the standby period, however, it is the same when the memory cell is accessed for the first time after the power-down period and then moves to the active period. Also, in the embodiments described above, application of the invention in a memory device was explained, however, it is not limited to a memory device and could be applied to any general-purpose LSI device.

As explained above, this invention comprises a first step-down circuit for stepping down the power-supply voltage and generating a first step-down voltage, and a second step-down circuit for stepping down the first step-down voltage and generating a second step-down voltage, so the second step-down voltage does not become larger and exceed the first step-down voltage even during the standby period or power-down period when the consumed current of the second step-down circuit is extremely small, and thus it is possible to prevent malfunction of the internal circuits of the memory device.

What is claimed is:

1. A memory device, comprising:

a memory core with a plurality of memory cells located at cross sections of word lines and bit lines;

a step-down voltage generating circuit that steps down a power-supply voltage to generate a first step-down voltage, and also generates a second step-down voltage lower than said first step-down voltage; and a sense amp, being supplied with said second step-down voltage as a driving voltage, for detecting potentials on said bit lines, and driving the bit line to said second step-down voltage, wherein said step-down voltage generating circuit comprises a first step-down circuit for generating said first step-down voltage, and a second step-down circuit for generating said second step-down voltage by stepping down said first step-down voltage.

2. The memory device of claim 1, wherein a consumed current corresponding to said second step-down voltage has a first current value in a first operating period, and a second current value lower than said first current value in a second operating period.

3. The memory device of claims 1 or 2 further comprising:

a peripheral circuit including a pre-decoder or a command decoder, wherein said first step-down voltage is supplied to said sense amp and said peripheral circuit, and said second step-down voltage is supplied to said sense amp.

4. The memory device of claims 1 or 2 wherein said first step-down voltage is supplied to said sense amp during an overdrive period when the sense amp drives for opening of the potential of said bit lines in speed up.

5. A memory device comprising:

a step-down voltage generating circuit for generating a first step-down voltage by stepping down a power-supply voltage, and a second step-down voltage lower than said first step-down voltage;

a peripheral circuit to which said first step-down voltage is supplied; and a memory core to which said second step-down voltage is supplied, wherein said step-down voltage generating circuit comprises a first step-down circuit for generating said first step-down voltage from said power-supply voltage, and a second step-down circuit for generating said second step-down voltage from said first step-down voltage.

6. The memory device of claim 5, wherein a consumed current corresponding to said second step-down voltage is a first current value in a first operating period, and a second current value lower than said first current value in a second operating period.

7. A LSI device, comprising:

a step-down voltage generating circuit for generating a first step-down voltage by stepping down a power-supply voltage and a second step-down voltage lower than said first step-down voltage;

a first internal circuit to which said first step-down voltage is supplied; and a second internal circuit to which said second step-down voltage is supplied, wherein said step-down voltage generating circuit comprises a first step-down circuit for generating said first step-down voltage from said power-supply voltage, and a second step-down circuit for generating said second step-down voltage from said first step-down voltage.

8. The LSI of claim 7, wherein a consumed current corresponding to said second step-down voltage is a first current value in a first operating period, and a second current value lower than said first current value in a second operating period.

* * * * *